(12) United States Patent
Park et al.

(10) Patent No.: US 6,396,096 B1
(45) Date of Patent: May 28, 2002

(54) DESIGN LAYOUT FOR A DENSE MEMORY CELL STRUCTURE

(75) Inventors: Young-Jin Park, Poughkeepsie; Carl J. Radens, LaGrangeville, both of NY (US)

(73) Assignees: International Business Machines Corporation, Armonk, NY (US); Infineon Technologies North America Corp., San Jose, CA (US)

(*) Notice: Subject to any disclaimer, the term of this patent is extended or adjusted under 35 U.S.C. 154(b) by 6 days.

(21) Appl. No.: 09/597,401

(22) Filed: Jun. 21, 2000

(51) Int. Cl.[7] .............................................. H01L 27/108
(52) U.S. Cl. ..................... 257/296; 257/303; 257/306; 257/908; 257/909
(58) Field of Search .............................. 257/296, 303, 257/306, 908, 909

(56) References Cited

U.S. PATENT DOCUMENTS

| | | | |
|---|---|---|---|
| 5,014,103 A | * 5/1991 | Ema | ............................. 357/41 |
| 5,214,496 A | 5/1993 | Sunami et al. | |
| 5,264,712 A | 11/1993 | Murata et al. | |
| 5,457,064 A | * 10/1995 | Lee | ............................. 437/52 |
| 5,572,053 A | 11/1996 | Ema | |
| 5,656,528 A | 8/1997 | Wahlstrom | |
| 6,034,877 A | * 3/2000 | Bronner et al. | ............... 365/51 |
| 6,037,620 A | * 3/2000 | Hoenigschmid et al. | .... 257/296 |
| 6,166,408 A | * 12/2000 | Nishimura et al. | ......... 257/306 |

* cited by examiner

*Primary Examiner*—Eddie Lee
*Assistant Examiner*—Matthew E. Warren
(74) *Attorney, Agent, or Firm*—Scully, Scott, Murphy & Presser; Steven Capella, Esq.

(57) ABSTRACT

A design layout for a memory cell structure is provided that achieves maximized channel length on the active areas, while not constricting the contact area of the capacitor contacts is provided. Specifically, the layout design provides a semiconductor memory structure that includes wordlines, bitlines, and sub-$8F^2$ memory cells in a semiconductor substrate, said memory cells comprising a transfer gate transistor having a source region and a drain region formed in said substrate and a gate electrode, a memory cell stacked storage capacitor, a wordline conductor portion contacting said gate electrode, said wordline gate conductor portion forming part of one of said wordlines, a bitline contact to said source region, said bitline contact connecting said source region to one of said bitlines, and a capacitor contact between said capacitor and said drain region, wherein for at least one of said cells, said bitline contact and said capacitor contact are positioned at a distance from each other greater than from said bitline contact to a closest contact of another of said cells and greater than from said capacitor contact to a closest contact of another of said cells.

10 Claims, 6 Drawing Sheets

DESIGN LAYOUT FOR A DENSE MEMORY CELL STRUCTURE

FIELD OF THE INVENTION

The present invention relates to a semiconductor memory structure, and more particularly to a design layout, i.e., arrangement, for a semiconductor memory structure which includes a double wiggled wordline offset that increases the effective channel length of the array device without constricting the area for the capacitor contacts as is typically the case with prior art wiggled wordline arrangements. In the present invention, various offsets are employed to achieve maximized channel length, while maintaining maximized contact areas for the bitline contacts and the capacitor contacts.

BACKGROUND OF THE INVENTION

In semiconductor memory device manufacturing, the channel length of the DRAM (dynamic random access memory) transfer gate devices continues to shrink aggressively. Conventional scaling techniques are limited in their applicability for low leakage DRAM transfer devices. There is thus a need for novel cell layouts which provide only limited shrinking of the channel length.

As the DRAM cell size decreases, the transfer gate (i.e., gate polysilicon) has consequently shrunk with it. Earlier cell sizes (>8F$^2$) allow for wiggled gates to keep the array transistor 'off' leakage to a minimum. With the onset of 8F$^2$ and other denser memory cells with equal lines and spaces at minimum feature size, F, in the wordline direction, there is need to provide larger gate lengths of the array transistors so as to ensure retention of stored data. Large gate lengths are especially required to allow for using a "hard" device turnoff. With small gate lengths, a hard turnoff oftentimes results in some loss of stored information. In contrast, larger gate lengths prevent loss of data during a hard device turnoff.

A typical prior art design layout for a sub-8F$^2$ memory cell is shown in FIG. 1. Specifically, FIG. 1 is a top view of a prior art 6F$^2$ memory cell which includes vertical bitlines 10, horizontal wordlines 12, capacitor contacts 14, bitline contacts 16, and active (diffusion) areas 18 that include a source region and a drain region. As shown in FIG. 1, the distance between each wordline is 1F, whereas the distance between each bitline is 2F.

Reference is now made to the top, right hand corner of FIG. 1 in which the distances between 4 neighboring contacts (labeled as A, B, C and D, respectively) are shown. It should be noted that the distance between AB represents the channel length of the gate polysilicon on the active area of the layout, while the distance DC represents the length of the wordline on an isolation region. An expanded view of this region of the prior art layout is shown in FIG. 2. As is shown in FIG. 2, the distance between contacts represented as AB, CD, AC is the same and is approximately 2.24 F. However, the distance between contacts BC and DA is only about 2F.

The prior art structure shown in FIGS. 1–2 exhibits short channel effects because of the 1F nominal channel length. For improved device performance, channel length AB needs to be maximized and the distances between any contact needs to be the same.

To maximize the gate length AB, wiggled wordline design layouts, such as shown in FIG. 3, are typically employed. In the wiggled wordline design of prior art structures, the wordlines are made to jog about the various contact regions of the memory cells. Despite obtaining maximum gate lengths on the active areas and maximum contact areas for bitline contacts, prior art wiggled wordline design layouts do not achieve maximum contact area for the capacitor contacts. Instead, the contact area of the capacitor contacts in prior art wiggled wordline structures is constricted. Because of this constriction, prior art wiggled wordlines have a high contact resistance associated therewith.

In view of the drawbacks with prior art memory structures, there is a continued need to develop new and improved design layouts for memory cells in which the channel length of the gate conductor on the active areas is maximized, while maintaining maximum contact areas for both the bitline contact and the capacitor contact. Such a design layout would be extremely beneficial since it would result in a memory structure having improved operation properties as compared to prior art wiggled wordline designs.

SUMMARY OF THE INVENTION

One object of the present invention is to provide a design layout for a dense memory cell (sub-8F$^2$) structure that achieves a maximized gate conductor channel length so as to permit the array device to be turned off 'hard' without the loss of any stored data.

A further object of the present invention is to provide a design layout for a memory cell structure wherein increased channel lengths can be achieved on the active areas of the structure without loss of capacitor contact area.

A still further object of the present invention is to provide a design layout for a memory cell structure wherein increased channel lengths can be achieved, while maintaining maximum contact area for the bitline contacts and capacitor contacts.

An even further object of the present invention is to provide a design layout for a dense memory cell that results in a structure having improved operational properties associated therewith.

These and other objects and advantages are achieved in the present invention by utilizing multiple offsets in the wordline to enable the connection of the bitline contacts and capacitor contacts to the diffusion regions in the substrate. The unique offsets employed in the present invention include a conventional wiggled wordline offset which is used to maximize channel length of the array device on the active areas and to permit maximum contact area for the bitline contact, and additional offsets which provide maximum contact area for both the capacitor and the bitline diffusion contacts.

The combination of offsets employed in the present invention is referred to herein as a "double wiggled wordline offset". The standard wordline offset, i.e., wiggled wordline offset of the prior art, allows a maximum contact area for the bitline contacts at the expense of the contact area of the capacitor contact. To overcome this problem, additional offsetting is employed in the present invention to ensure that the distance between neighboring contacts is the same, while the capacitor contacts and bitline contacts on the active areas have a much larger distance than the other contacts.

Specifically, the design layout of the present invention provides a semiconductor memory structure that comprises horizontally arranged wordlines, vertically arranged bitlines, and sub-8F$^2$ memory cells in a semiconductor substrate, said memory cells comprising a transfer gate transistor having a source region and a drain region formed in said substrate and a gate electrode, a memory cell stacked storage capacitor, a wordline conductor portion contacting said gate electrode, said wordline gate conductor portion forming part of one of said wordlines, a bitline contact to said source region, said bitline contact connecting said source region to one of said bitlines, and a capacitor contact between said capacitor and said drain region, wherein for at least one of said cells, said bitline contact and said capacitor contact are positioned at a distance from each other greater than from said bitline contact to a closest contact of another of said cells and greater than from said capacitor contact to a closest contact of another of said cells.

In one preferred embodiment of the present invention, the memory cells are $6F^2$ memory cells.

In yet another preferred embodiment of the present invention, at least one of the wordlines has an average width and said wordline conductor portion has a width greater than the average width.

In above described memory structure, the design layout is such that the channel length of the transfer device is maximized and the contact areas of both the bitline contact and the capacitor contact are maximized. The above-mentioned properties are achieved in the present invention by utilizing a conventional wiggled wordline offset coupled with offsetting one column of capacitor contacts in one direction, while offsetting an alternating column of capacitor contacts in an opposite direction. In the present invention, the capacitor contacts are offset in the vertical direction.

DETAILED DESCRIPTION OF THE INVENTION

The present invention which provides a novel design layout for a dense memory structure having maximized channel lengths as well as maximized contact areas for both the bitline contact and the wordline contact will now be described in more detail by referring to FIGS. 4–6 of the present invention.

Before discussing these drawings in greater detail, it should be noted that the novelty of the present invention resides in the arrangement, i.e., design layout, of the various elements, not in the integration scheme that is used in making the same. Instead, the elements shown in memory structure of the present invention are made utilizing any conventional integration scheme that is capable of making a sub-$8F^2$ memory structure.

Moreover, the elements of the inventive structure are composed of conventional materials that are also well known to those skilled in the art. Since the integration scheme used in making the memory structure and the composition of the elements are well known to those skilled in the art, a detail discussion regarding each is not provided herein.

Figure 4:
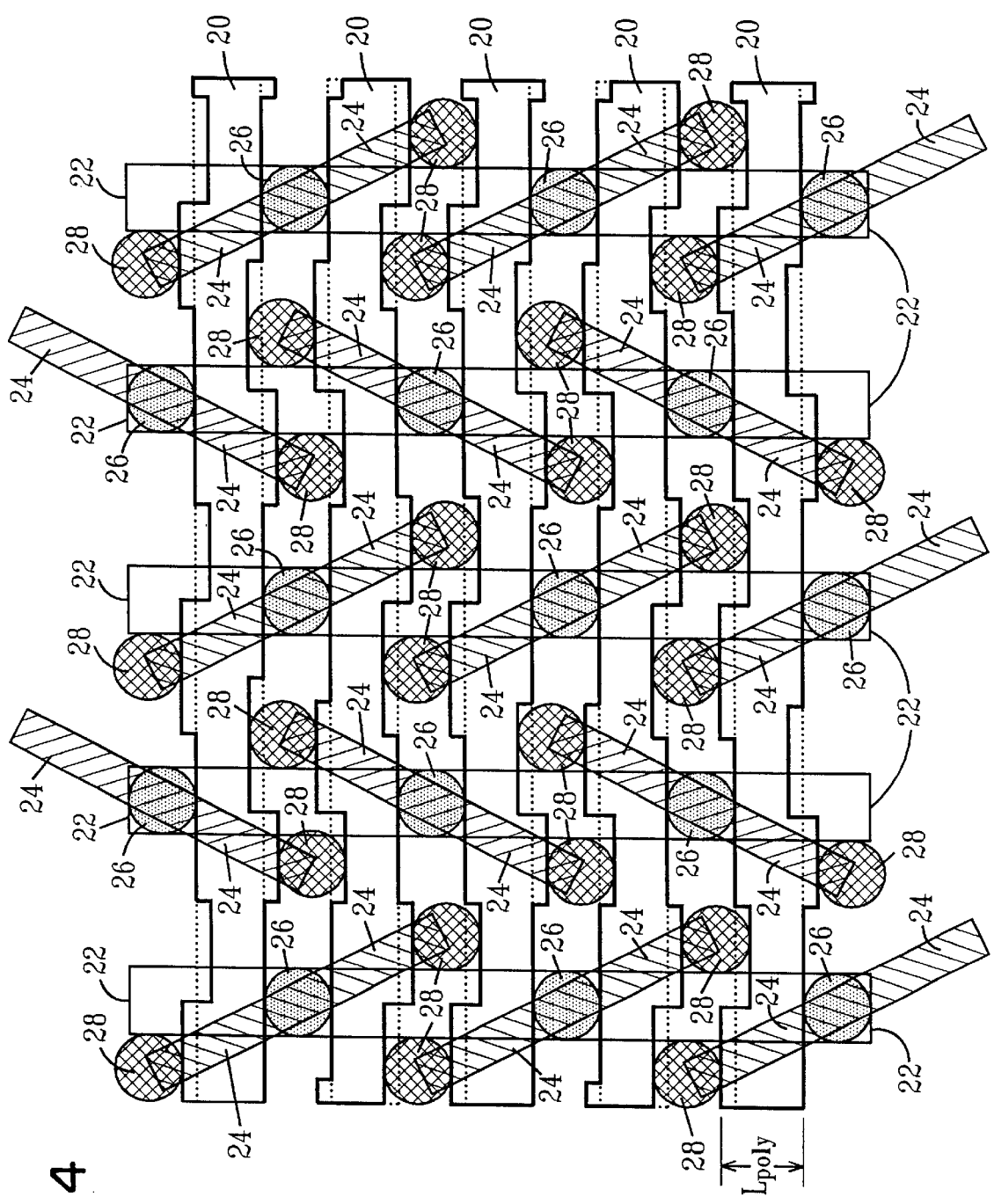
FIG. 4 is a top view of a memory structure design of the present invention in which a double wiggled wordline offset is employed.

Now turning to FIG. 4, there is shown the inventive design layout of the present invention. Specifically, FIG. 4 illustrates the inventive design layout for a sub-$8F^2$ memory structure which includes horizontally arranged wordlines 20, vertically arranged bitlines 22, and sub-$8F^2$ memory cells. In a preferred embodiment of the present invention, each of the memory cells present in the structure is a $6F^2$ memory cell.

As is shown in FIG. 4, the wordlines are arranged so that they jog about the various contact regions of the memory cells. This wordline jog is achieved in the present invention by utilizing a conventional wiggled wordline offsetting scheme in which the gate length on the active region 24 is made larger than 1F, while adjusting the channel length on the isolation region to 1F. In FIG. 4, the contact areas of the capacitor contacts and the bitline contacts have been adjusted so that the contacts in the active regions are larger than the distance between each neighboring contact.

It should be noted that some of the components that make-up the memory cells shown in the drawings of the present invention are not labeled since many of the memory components are beneath the elements shown in the drawings. Moreover, some of the components of the memory cell such as source/drain regions are formed in the surface of a semiconductor substrate.

The semiconductor substrate employed in the present invention is comprised of any conventional semiconducting material such as Si, SiGe, InAs, InP and other III/V compounds or layered structures such as Si/SiGe or Si/SiO$_2$/Si. The substrate can be of the n or p-type depending on the desired device to be fabricated. The substrate may contain various active regions, isolation regions and other like regions that are commonly employed in fabricating a memory cell.

The memory cells in the inventive design layout comprise a transfer gate transistor having a source region and a drain region formed in a surface of a semiconducting substrate and a gate electrode. These later regions are referred to herein as the active area of the memory cell and are labeled as region 24 in the drawings of the present invention. In FIG. 4, $L_{poly}$ represents the length of the gate polysilicon and the channel of the array device. The memory cells also include a memory cell stacked storage capacitor and, a wordline conductor portion contacting the gate electrode. In accordance with the present invention, the wordline gate conductor portion forms part of one of the wordlines. Each memory cell also includes a bitline contact 26 which is connected to the underlying source region. The bitline contact connects the underlying source region to one of said bitlines. Each cell also includes a capacitor contact 28 positioned between the capacitor and the drain region.

In order to overcome the drawbacks mentioned with prior art wiggled wordline offset arrangements, the design layout shown in FIG. 4 utilizes a doubled wiggled wordline offset to maximize the channel gate length and to maximize the contact areas of both the bitline contact and the capacitor contact, while maintaining the distance between neighboring contacts the same.

Maximization is achieved in the present invention by setting the channel length of the gate conductor greater than 1F and greater than the length of the channel length on the isolation regions. That is, in the inventive layout, the memory cells are arranged so that the distance between neighboring contacts is the same, while the capacitor contact and the bitline contact in the active areas have a much larger distance.

These features of the inventive structure will now be described in more detail by referring to FIG. 5. Specifically, FIG. 5 is an expanded view of the top, right hand portion of the structure illustrated in FIG. 4. As shown in FIG. 5, the distance of the capacitor contact and bitline contact, represented as AB, is greater than the distance between neighboring contacts BC, CD and DA, which contacts are separated by the same distance.

Figure 5:
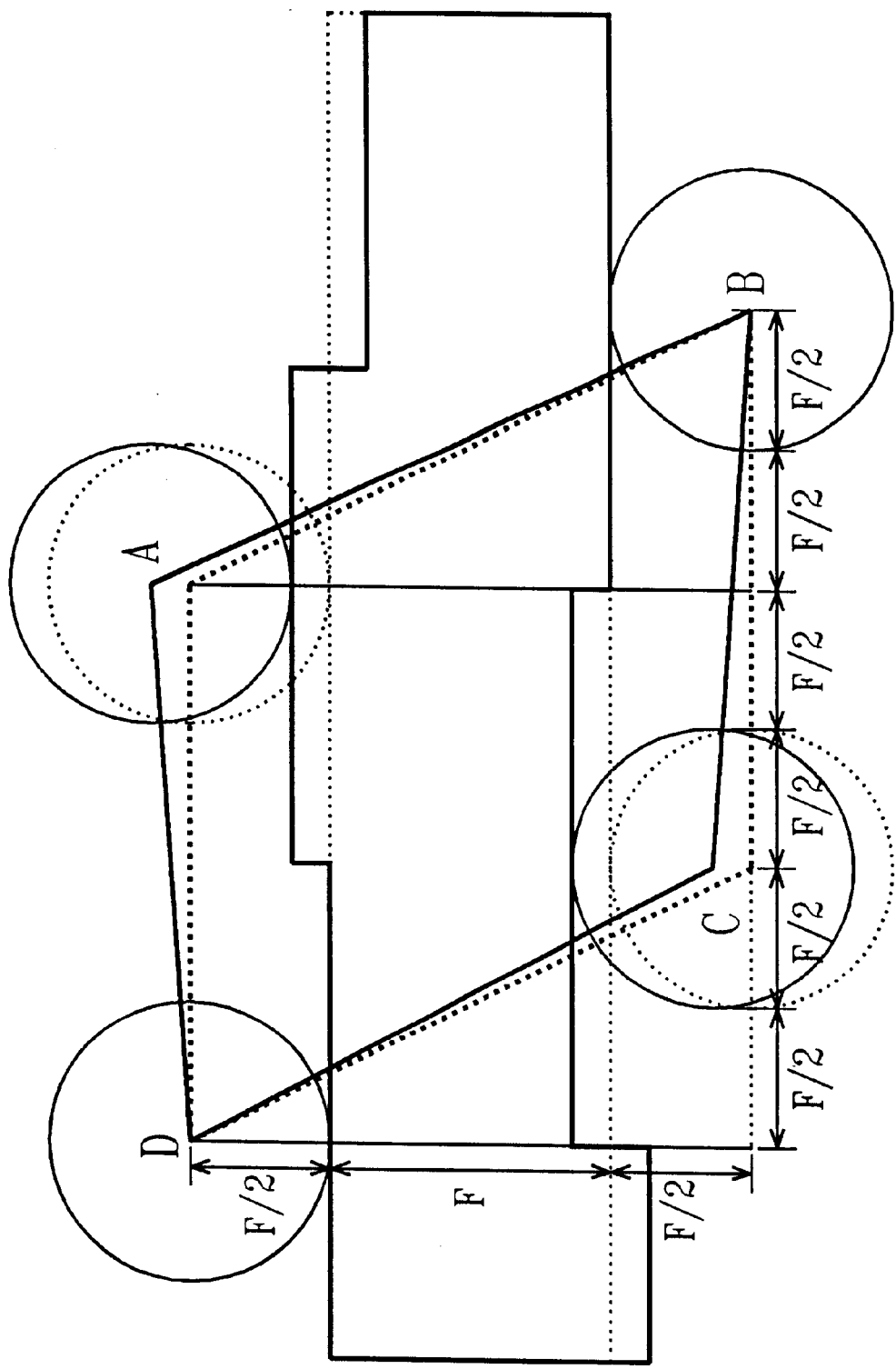
FIG. 5 is an expanded view of the memory structure design of the top, right hand portion of FIG. 4.
Figure 6:
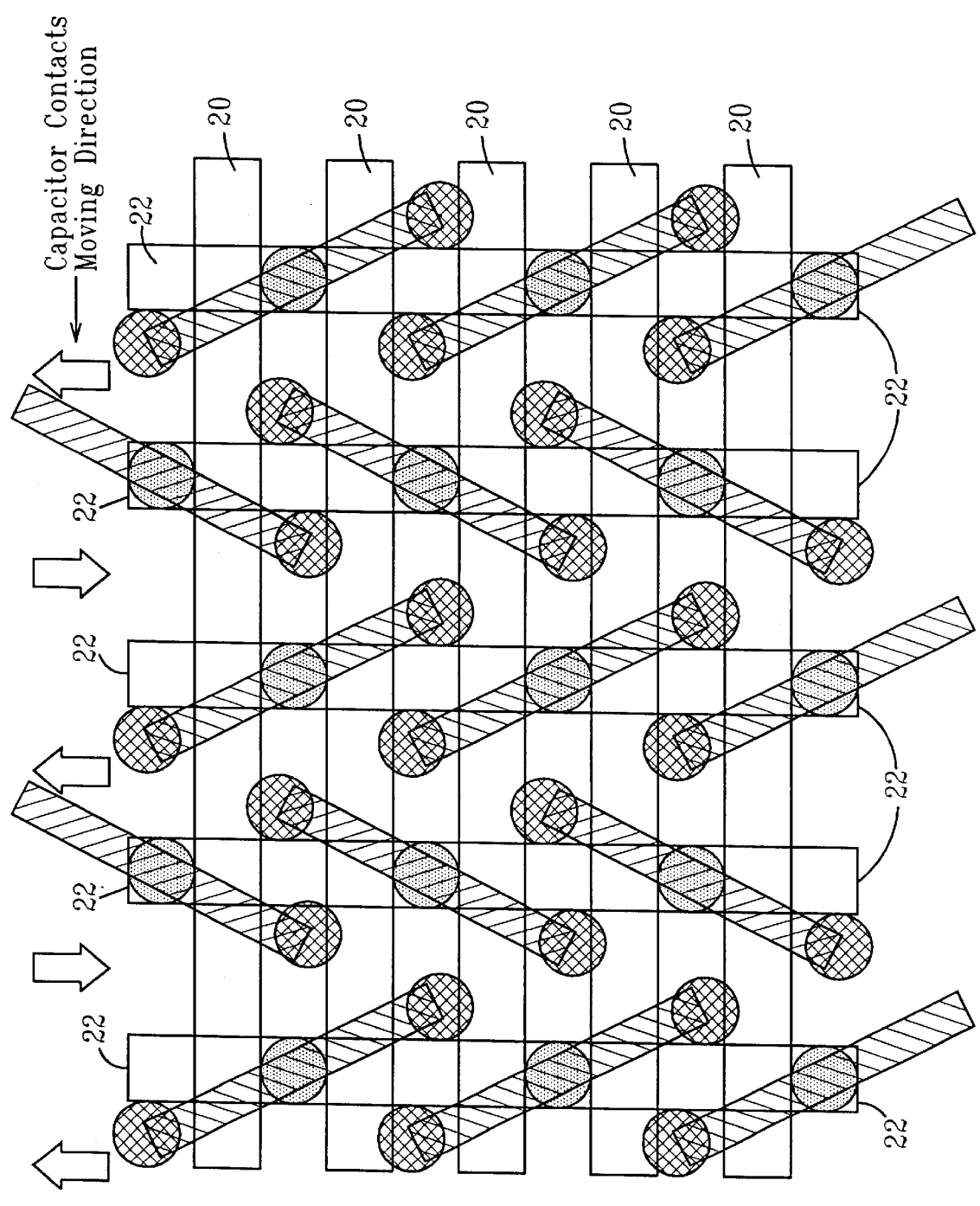
FIG. 6 is a top view illustrating how the capacitor contacts are offset in the present invention so as to achieve maximized contact area for the capacitor contacts.

As stated above, a wiggled wordline offset, as shown in FIG. 5, is employed in achieving maximized channel length on active region AB. FIG. 6 illustrates the other offsetting that is employed in the present invention to achieve maximized contact areas for the capacitor contacts and the bitline contacts. Specifically, during the course of fabricating the capacitor contacts, a lithographic pattern that is capable of offsetting each alternating column of capacitor contacts is employed so that one column of capacitor contacts is offset in one direction, See FIG. 6, whereas the alternating column of capacitor contacts are offset in the opposite direction as the previously offset column of capacitor contacts.

Figure 1:
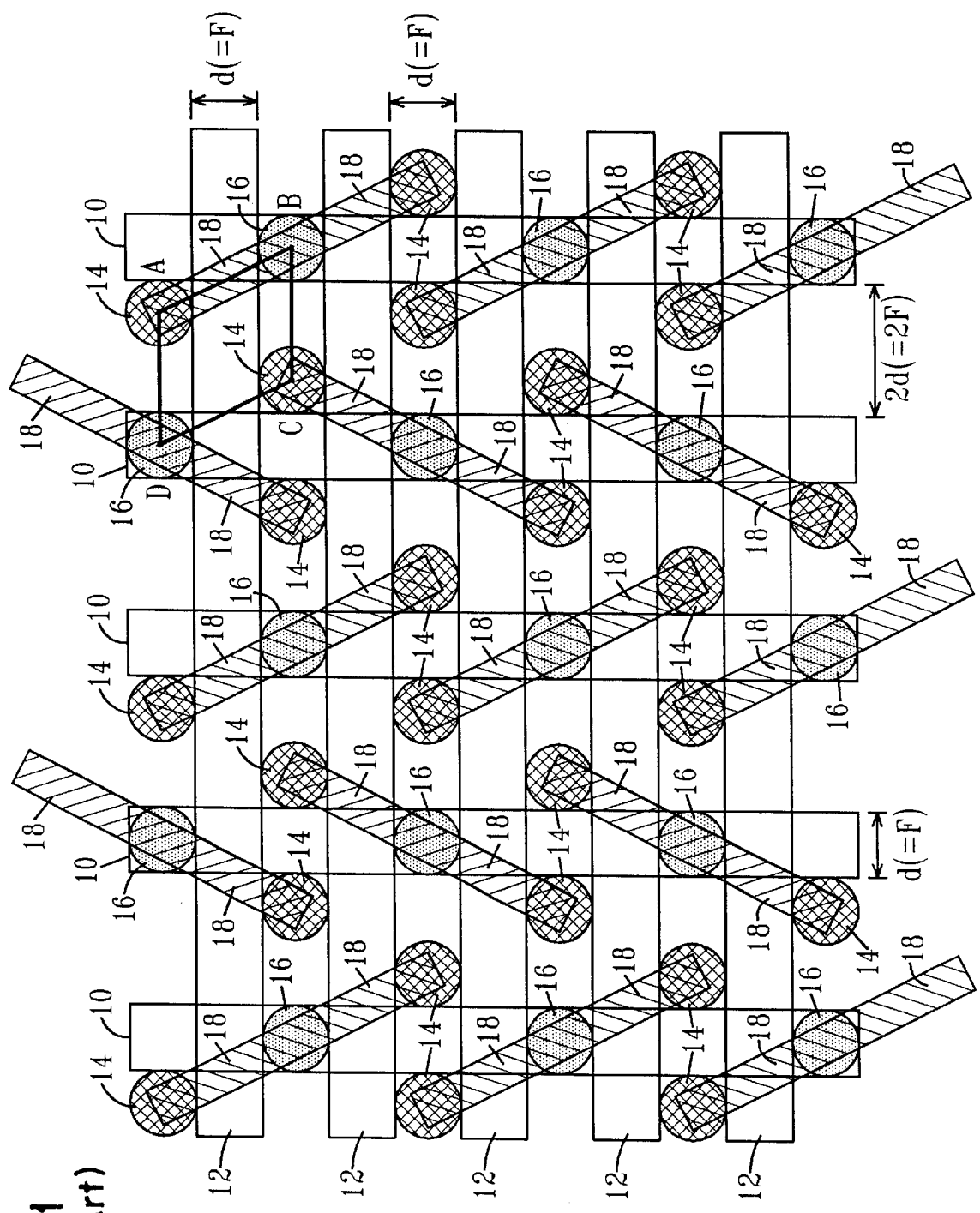
FIG. 1 is a prior art $6F^2$ memory cell layout (top view).
Figure 2:
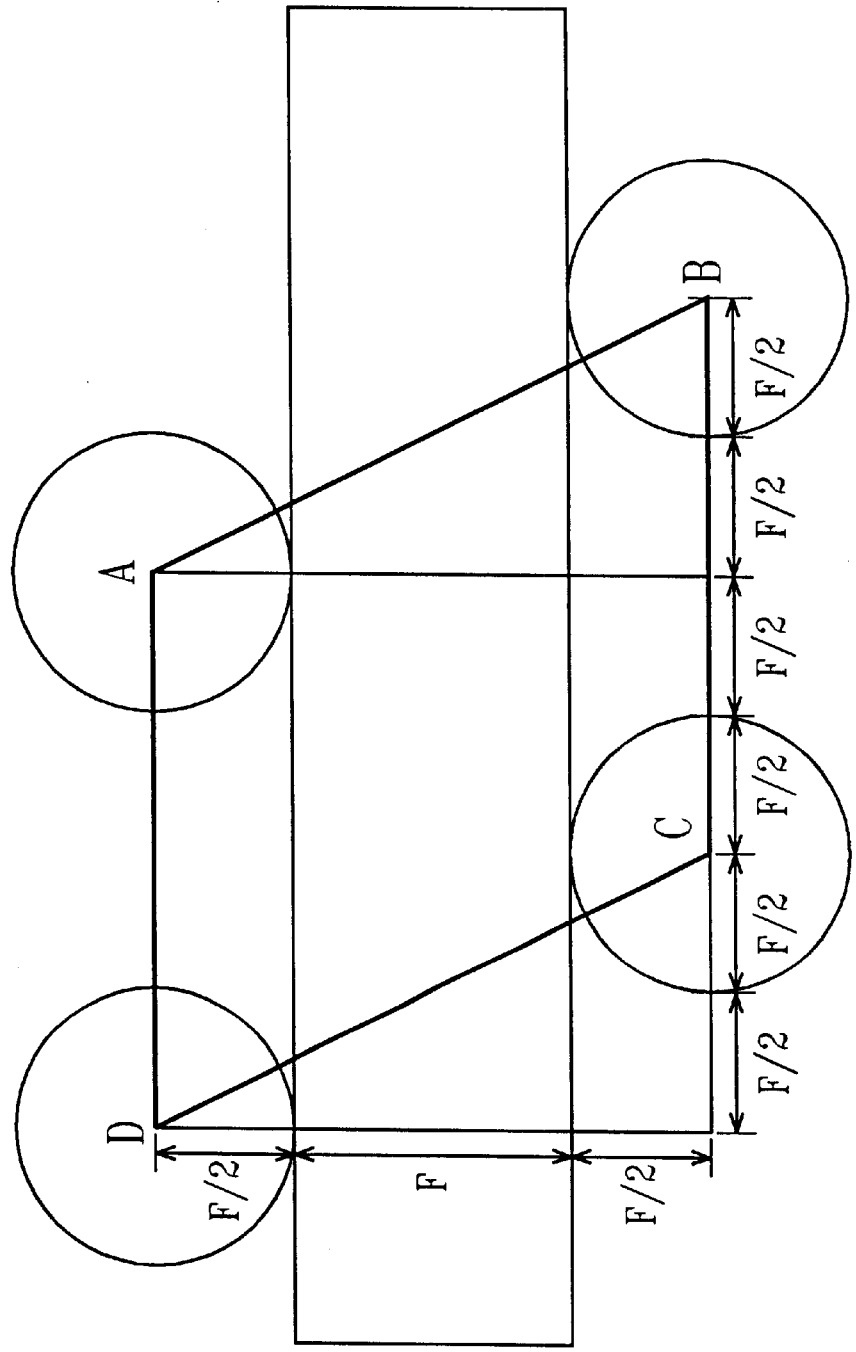
FIG. 2 is an expanded view of the top, right hand portion of FIG. 1 showing regions A, B, C and D.
Figure 3:
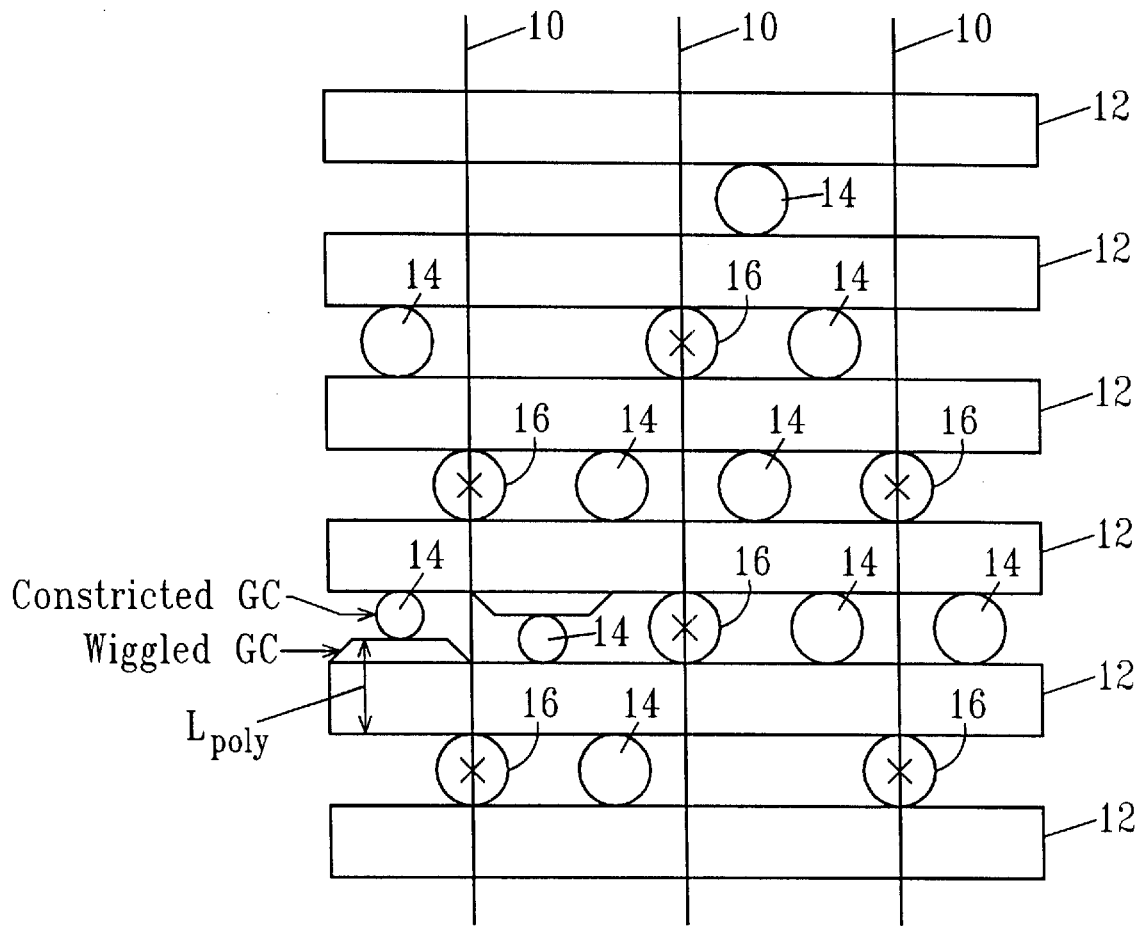
FIG. 3 is a top view of a prior art wiggled wordline cell arrangement.

The above-mentioned capacitor contact offsetting ensures that the distance between any neighboring contacts is the same, i.e., BC=CD=DA, and that AB is greater than BC, CD or DA. That is, the capacitor contact offsetting allows for maximized contact area for the capacitor contacts. No constriction of the capacitor contacts, as seen in FIG. 3, is observed utilizing the inventive design layout of the present invention.

The design layout of the present invention which includes a combination of a conventional waggled wordline offset and a capacitor contact offset is less sensitive to overlay variations between wordline and active area as compared to any prior art design layouts heretofore known to applicants. Moreover, the inventive design layout enables the channel length to be increased, without constricting the contact area of the capacitor contacts. Thus, the inventive design layout provides an advancement in the art inasmuch as the inventive layout provides improved data retention and contact resistance as compared to prior art memory structures that are based only on a wiggled wordline configuration.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A semiconductor memory structure comprising wordlines, bitlines, and sub-$8F^2$ memory cells in a semiconductor substrate, each of said memory cells comprising:

a transfer gate transistor having a source region and a drain region formed in said substrate and a gate electrode, a memory cell stacked storage capacitor, a wordline conductor portion contacting said gate electrode, said wordline gate conductor portion forming part of one of said wordlines, a bitline contact to said source region, said bitline contact connecting said source region to one of said bitlines, and a capacitor contact between said capacitor and said drain region, wherein each alternating column of capacitor contacts of said memory cells are offset in opposing directions and for at least one of said cells, said bitline contact and said capacitor contact are positioned at a distance from each other greater than from said bitline contact to a closest contact of another of said cells and greater than from said capacitor contact to a closest contact of another of said cells thereby maximizing (i) channel gate length of said transfer gate transistor and (ii) contact areas of both said bitline contact and said capacitor contact.

2. The memory structure of claim 1 wherein at least one of said wordlines has an average width and a width at said wordline conductor portion greater than said average width.

3. The memory structure of claim 1 wherein said memory cells are $6F^2$ memory cells.

4. The memory structure of claim 1 wherein said wordlines are arranged horizontally in rows.

5. The memory structure of claim 1 wherein said bitlines are arranged vertically in columns.

6. The memory cell structure of claim 1 wherein said wordlines jog about said bitline contacts and capacitor contacts.

7. The memory structure of claim 1 wherein said semiconductor substrate is composed of Si, SiGe, GaAs, InP, InAs, Si/SiGe or $Si/SiO_2/Si$.

8. The memory structure of claim 1 wherein said transfer gate has a gate length L.

9. The memory structure of claim 8 wherein L is greater than a length of a wordline on an isolation region.

10. The memory structure of claim 1 wherein neighboring contacts are separated by equal distances.

* * * * *